United States Patent
Kuo et al.

(10) Patent No.: US 9,541,939 B2
(45) Date of Patent: Jan. 10, 2017

(54) SWITCHING CURRENT SOURCE CIRCUIT AND CONTROL METHOD THEREOF

(71) Applicant: MediaTek Inc., Hsin-Chu (TW)

(72) Inventors: Liang-Ting Kuo, Tainan (TW); Wei-Hao Chiu, Taichung (TW)

(73) Assignee: MEDIATEK INC., Hsin-chu (TW)

( * ) Notice: Subject to any disclaimer, the term of this patent is extended or adjusted under 35 U.S.C. 154(b) by 187 days.

(21) Appl. No.: 14/291,463

(22) Filed: May 30, 2014

(65) Prior Publication Data
US 2015/0346755 A1 Dec. 3, 2015

(51) Int. Cl.
| | |
|---|---|
| *G05F 3/02* | (2006.01) |
| *H03K 17/30* | (2006.01) |
| *H03K 19/00* | (2006.01) |
| *G05F 3/26* | (2006.01) |

(52) U.S. Cl.
CPC .............. *G05F 3/02* (2013.01); *H03K 17/302* (2013.01); *H03K 19/0027* (2013.01); *G05F 3/26* (2013.01)

(58) Field of Classification Search
CPC ............... G05F 3/26; G05F 3/22; G05F 3/30; G05F 3/262; G05F 3/267; G05F 3/265; G05F 1/56
See application file for complete search history.

(56) References Cited

U.S. PATENT DOCUMENTS

| | | | | |
|---|---|---|---|---|
| 5,408,174 A | * | 4/1995 | Leonowich | G05F 3/262 323/315 |
| 5,796,767 A | * | 8/1998 | Aizawa | G05F 3/242 372/38.02 |
| 6,236,252 B1 | * | 5/2001 | Genest | G05F 3/262 327/108 |
| 7,130,225 B1 | * | 10/2006 | Terrovitis | G11C 5/145 327/157 |
| 7,230,410 B1 | * | 6/2007 | Jordan | G05F 3/262 307/52 |
| 8,786,360 B2 | | 7/2014 | Ang | |
| 2005/0127988 A1 | * | 6/2005 | Ozasa | H03K 17/04123 327/543 |
| 2005/0264344 A1 | * | 12/2005 | Kim | H04W 52/028 327/538 |
| 2009/0201080 A1 | * | 8/2009 | Imai | G05F 3/262 327/543 |
| 2013/0187629 A1 | * | 7/2013 | Figueiredo | H03M 1/002 323/315 |

* cited by examiner

*Primary Examiner* — Gustavo Rosario Benitez
(74) *Attorney, Agent, or Firm* — McClure, Qualey & Rodack, LLP

(57) ABSTRACT

A switching current source circuit is provided. A current source drains a bias current from a power supply via a first mirror transistor. A second mirror transistor has a source coupled to the power supply, a gate coupled to the gate of the first mirror transistor, and a drain for providing an output current. A switch is coupled between the gates of the first and second mirror transistors, and has a control terminal for receiving a control signal. A first capacitor is coupled between the gate of the second mirror transistor and the voltage generating unit. A second capacitor is coupled between the gate of the second mirror transistor and a ground. The voltage generating unit selectively provides a first voltage or a second voltage different from the first voltage to the first capacitor according to the control signal.

20 Claims, 6 Drawing Sheets

SWITCHING CURRENT SOURCE CIRCUIT AND CONTROL METHOD THEREOF

BACKGROUND OF THE INVENTION

Field of the Invention

The invention relates to a switching current source circuit, and more particularly to a fast switching current source circuit for providing a fast-switched output current.

Description of the Related Art

For a switching circuit, such as a switched-capacitor circuit, a bias current of operational amplifiers (OPAMPs) can be decreased at its sampling phase. A switched-capacitor circuit is a circuit that moves charges between different sampling capacitors in order to achieve a desired signal processing function. The switched-capacitor circuit can accurately implement the signal processing function based on ratios of capacitor sizes and a sampling rate. Switched-capacitor circuits are widely used to implement various circuit blocks such as sigma-delta analog-to-digital converters ($\Sigma\Delta$ ADCs), sigma-delta digital-to-analog converters ($\Sigma\Delta$ DACs), filters, decimators, etc.

If the bias current of the switching circuit is small or the loading of the bias current is heavy, the bias current requires a long settling time when the switching circuit is switching. In general, a higher bias current or a driving buffer is used to overcome the long settling time. However, extra static power consumption is increased.

BRIEF SUMMARY OF THE INVENTION

A switching current source circuit and control methods thereof are provided. An embodiment of a switching current source circuit is provided. The switching current source circuit comprises a first mirror transistor coupled between a power supply and a current source, a second mirror transistor, a switch coupled between the gates of the first and second mirror transistors, a voltage generating unit, a first capacitor coupled between the gate of the second mirror transistor and the voltage generating unit, and a second capacitor coupled between the gate of the second mirror transistor and a ground. The current source drains a bias current from the power supply via the first mirror transistor. The second mirror transistor has a source coupled to the power supply, and a drain for providing an output current. The switch has a control terminal for receiving a control signal. The voltage generating unit selectively provides a first voltage or a second voltage different from the first voltage to the first capacitor according to the control signal.

Furthermore, an embodiment of a control method for a switching current source circuit is provided. The switching current source circuit comprises a transistor pair formed by first and second mirror transistors, a switch coupled between gates of the first and second mirror transistors, a first capacitor coupled to the gate of the second mirror transistor, and a second capacitor couple between the gate of the second mirror transistor and a ground. A bias current is drained from a power supply via the first mirror transistor. An output current corresponding to the bias current is drained from the power supply via the second mirror transistor when the switch is turned on. A first voltage or a second voltage different from the first voltage is selectively provided to the first capacitor in response to a switching state of the switch, by a voltage generating unit.

Moreover, another embodiment of a control method for a switching current source circuit is provided. The switching current source circuit comprises a first mirror transistor coupled between a power supply and a current source, and a second mirror transistor coupled between the power supply and a loading device. A bias current is drained from the power supply to the current source via the first mirror transistor. Gates of the first and second mirror transistors are selectively connected or disconnected according to a control signal. A first voltage couples to the gate of the second mirror transistor when the gates of the first and second mirror transistors are connected. A second voltage different from the first voltage couples to the gate of the second mirror transistor when the gates of the first and second mirror transistors are disconnected. When the gates of the first and second mirror transistors are connected, an output current corresponding to the bias current is drained from the power supply to the loading device via the second mirror transistor.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
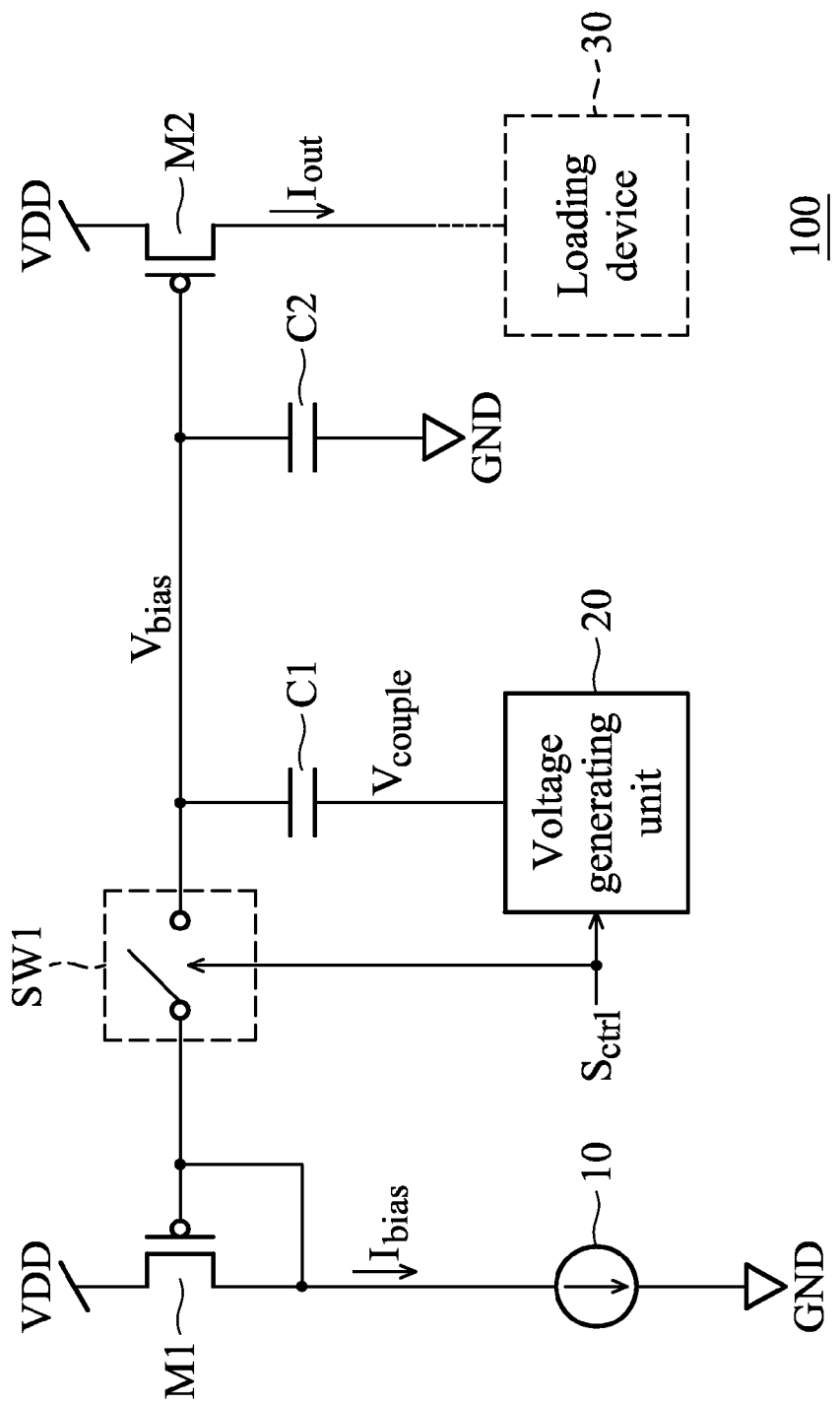
FIG. 1 shows a switching current source circuit according to an embodiment of the invention.

FIG. 1 shows a switching current source circuit 100 according to an embodiment of the invention. The switching current source circuit 100 is capable of providing a fast-switched output current $I_{out}$ to a loading device 30 (i.e. a switching circuit), wherein the fast-switched output current $I_{out}$ functions as a bias current of active devices (e.g. operational amplifiers) within the loading device 30. The switching current source circuit 100 comprises two mirror transistors M1 and M2, a switch SW1, a capacitor C1, a current source 10 and a voltage generating unit 20. The mirror transistors M1 and M2 are PMOS transistors. The mirror transistor M1 is coupled between a power supply VDD and the current source 10, and a gate of the mirror transistor M1 is coupled to the current source 10. The current source 10 is coupled between the mirror transistor M1 and a ground GND. The mirror transistor M2 is coupled between the power supply VDD and the loading device 30. The switch SW1 is coupled between the gates of the mirror transistor M1 and M2, and a control terminal of the switch SW1 is controlled by a control signal $S_{ctrl}$. The capacitor C1 is coupled between the gate of the mirror transistor M2 and the voltage generating unit 20. Furthermore, the switching current source circuit 100 further comprises a capacitor C2. The capacitor C2 is coupled between the gate of the mirror transistor M2 and the ground GND. In one embodiment, the capacitor C2 is a parasitic capacitor. In FIG. 1, the voltage generating unit 20 selectively provides a coupling signal $V_{couple}$ having a first voltage V1 or a second voltage V2 to the capacitor C1 according to the control signal $S_{ctrl}$, wherein the second voltage V2 is different from the first voltage V1. For example, when the switch SW1 is turned on by the control signal $S_{ctrl}$, the voltage generating unit 20 provides the coupling signal $V_{couple}$ having the first voltage V1 to the capacitor C1. Conversely, when the switch SW1 is turned off by the control signal $S_{ctrl}$, the voltage generating unit 20 provides the coupling signal $V_{couple}$ having the second voltage V2 to the capacitor C1. In one embodiment, the second voltage V2 is greater than the first voltage V1. Furthermore, in another embodiment, the voltage generating unit 20 may be a digital-to-analog converter, which is capable of converting the control signal $S_{ctrl}$ into the coupling signal $V_{couple}$, i.e. the first voltage V1 and the second voltage V2 have analog voltage level. In FIG. 1, when the switch SW1 is turned on, the mirror transistors M1 and M2 and the current source 10 form a current mirror. Therefore, the current source 10 drains a bias current $I_{bias}$ from the power supply VDD to the ground GND via the mirror transistor M1. Simultaneously, the output current $I_{out}$ is drained from the power supply VDD via the mirror transistor M2, wherein the ratio of the output current $I_{out}$ to the bias current $I_{bias}$ is determined according to a size rate of the mirror transistors M1 and M2. In the embodiment, the capacitor M1 is a coupling capacitor for coupling the coupling signal $V_{couple}$ to the gate of the mirror transistor M2, so as to provide a bias signal $V_{bias}$ at the gate of the mirror transistor M2. When the switch SW1 is turned on, the gates of the mirror transistors M1 and M2 are connected and controlled by the bias signal $V_{bias}$, so as to form the current mirror for providing the output current $I_{out}$ corresponding to the bias current $I_{bias}$, wherein the bias signal $V_{bias}$ corresponding to the coupling signal $V_{couple}$ has the first voltage V1. When the switch SW1 is turned off, the gates of the mirror transistors M1 and M2 are disconnected, and the bias signal $V_{bias}$ controls the mirror transistor M2 to decrease the output current $I_{out}$ or stop providing the output current $I_{out}$, wherein the bias signal $V_{bias}$ is changed to the second voltage V2 from the first voltage V1 in response to the coupling signal $V_{couple}$, i.e. the bias signal $V_{bias}$ is increased to decrease the output current $I_{out}$. The gate of the mirror transistor M1 and the gate of the mirror transistor M2 are disconnected when the switch SW1 is turned off, thereby no large output current $I_{out}$ is provided to the loading device 30. Thus, power consumption is decreased when the switch SW1 is turned off.

Figure 2:
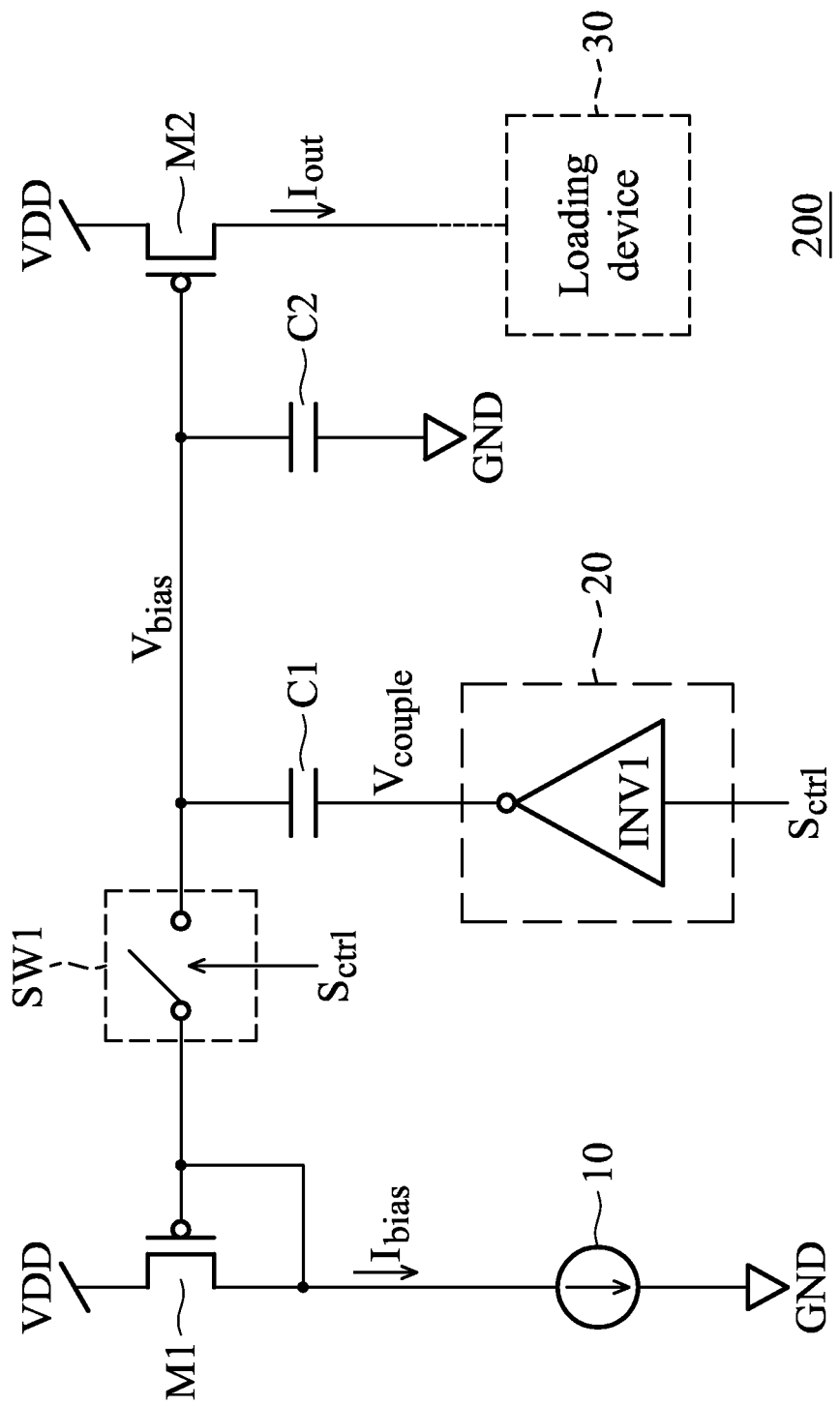
FIG. 2 shows a switching current source circuit according to another embodiment of the invention.
Figure 3:
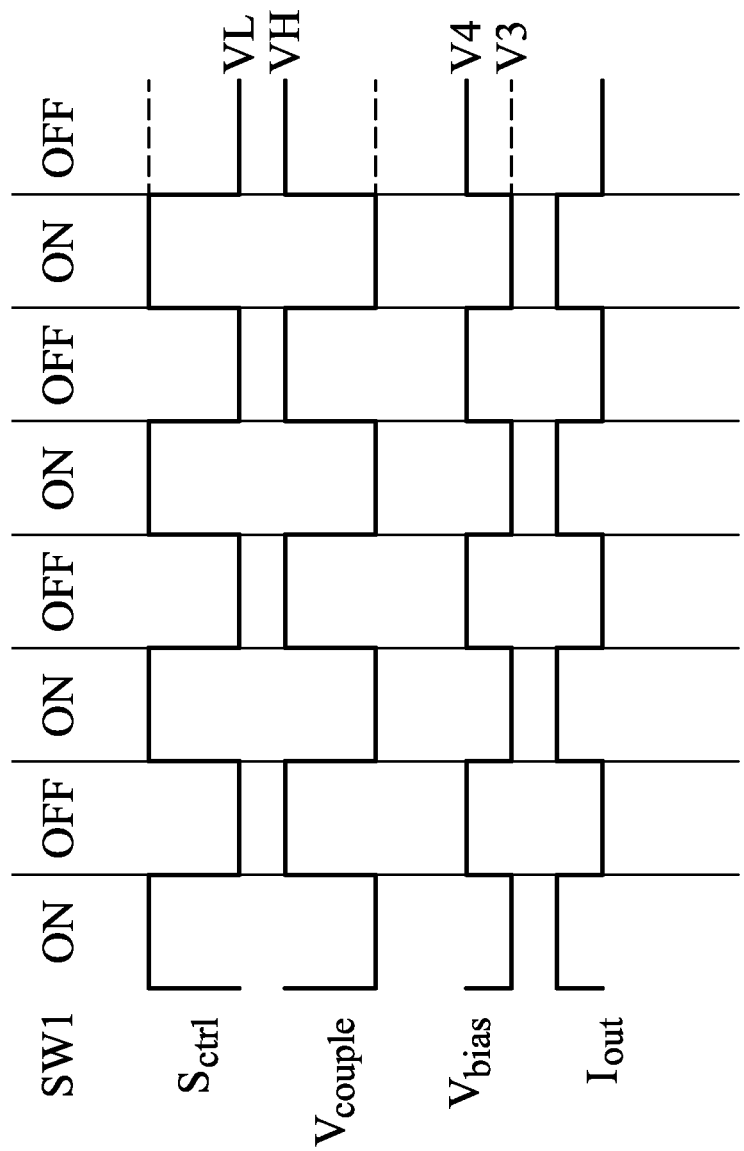
FIG. 3 shows a waveform illustrating the signals of the switching current source circuit of FIG. 2.

FIG. 2 shows a switching current source circuit 200 according to another embodiment of the invention, and FIG. 3 shows a waveform illustrating the signals of the switching current source circuit 200 of FIG. 2. Referring to FIG. 2 and FIG. 3 together, in the embodiment, the voltage generating unit 20 is a logic unit, which comprises an inverter INV1. The inverter INV1 provides the coupling voltage $V_{couple}$ according to the control signal $S_{ctrl}$. In the embodiment, the switch SW1 is turned on when the control signal $S_{ctrl}$ has a high logic level, and the switch SW1 is turned off when the control signal $S_{ctrl}$ has a low logic level. Furthermore, by using the inverter INV1, the coupling voltage $V_{couple}$ is complementary to the control signal $S_{ctrl}$. Therefore, when the switch SW1 is turned on by the control signal $S_{ctrl}$, the inverter INV1 provides the coupling voltage $V_{couple}$ having a low logic level to the capacitor C1, and then the coupling voltage $V_{couple}$ couples to the gate of the mirror transistor M2, so as to provide the bias signal $V_{bias}$ with a voltage V3 at the gates of the mirror transistors M1 and M2. Furthermore, when the switch is turned off by the control signal $S_{ctrl}$, the inverter INV1 provides the coupling voltage $V_{couple}$ having a high logic level to the capacitor C1, and then the coupling voltage $V_{couple}$ couples to the gate of the mirror transistor M2, so as to provide the bias signal $V_{bias}$ with a voltage V4 at the gate of the mirror transistor M2. In the embodiment, for the bias signal $V_{bias}$, a difference $\Delta V_{bias}$ between the voltages V3 and V4 is obtained according to the following equation:

$$\begin{aligned} \Delta V_{bias} &= V4 - V3 \\ &= \Delta V_{couple} \times \frac{C1}{C1+C2} \\ &= (VH - VL) \times \frac{C1}{C1+C2}, \end{aligned}$$

where VH represents a voltage corresponding to a high logic level, and VL represents a voltage corresponding to a low logic level. Therefore, by adjusting the difference $\Delta V_{couple}$ of the coupling voltage $V_{couple}$ or the capacitor C1, the difference $\Delta V_{bias}$ of the bias voltage $V_{bias}$ can be controlled. Furthermore, if the bias current $I_{bias}$ is small or the loading device 30 is a heavy load for the output current $I_{out}$, no long settling time is needed for the bias voltage $V_{bias}$ when the switch SW is switching. Moreover, due to the voltage generating unit 20 being a logic unit, no static current exists in the voltage generating unit 20. In one embodiment, a switching frequency of the switch SW1 can be increased when the loading device 30 is a smaller load for the output current $I_{out}$ and the mirror transistor M2 has a higher transconductance (gm).

Figure 4A:
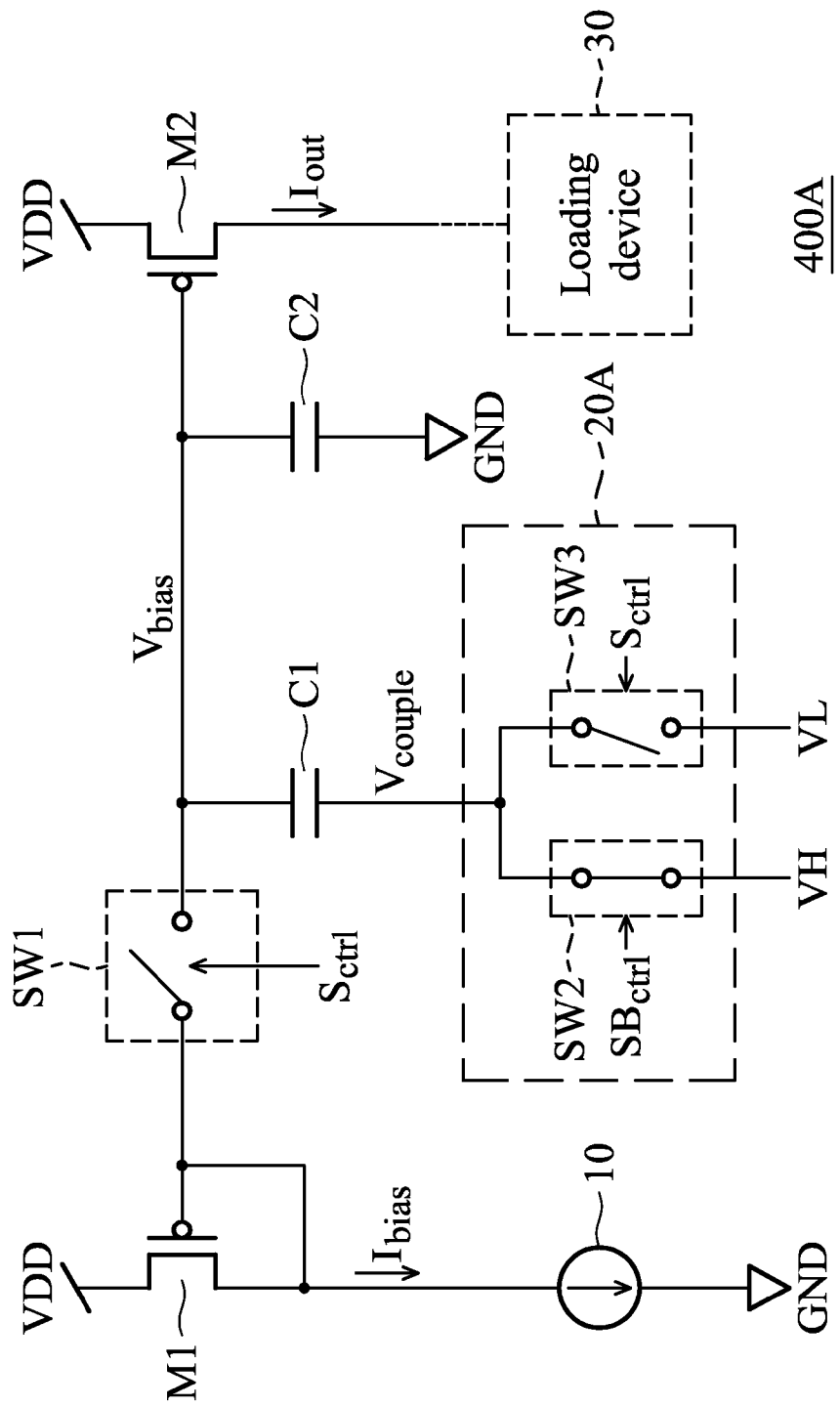
FIG. 4A shows a switching current source circuit according to another embodiment of the invention.

FIG. 4A shows a switching current source circuit 400A according to another embodiment of the invention. In the switching current source circuit 400A, a voltage generating unit 20A comprises two switches SW2 and SW3. In FIG. 4A, the switch SW2 is controlled by a control signal $SB_{ctrl}$, and the switches SW1 and SW3 are controlled by the control signal $S_{ctrl}$, wherein the control signal $SB_{ctrl}$ is complementary to the control signal $S_{ctrl}$. When the switch SW2 is turned on and the switches SW1 and SW3 are turned off, the voltage generating unit 20A provides the coupling voltage $V_{couple}$ according to the voltage VH corresponding to a high logic level. Conversely, when the switch SW2 is turned off and the switches SW1 and SW3 are turned on, the voltage generating unit 20A provides the coupling voltage $V_{couple}$ according to the voltage VL corresponding to a low logic level.

Figure 4B:
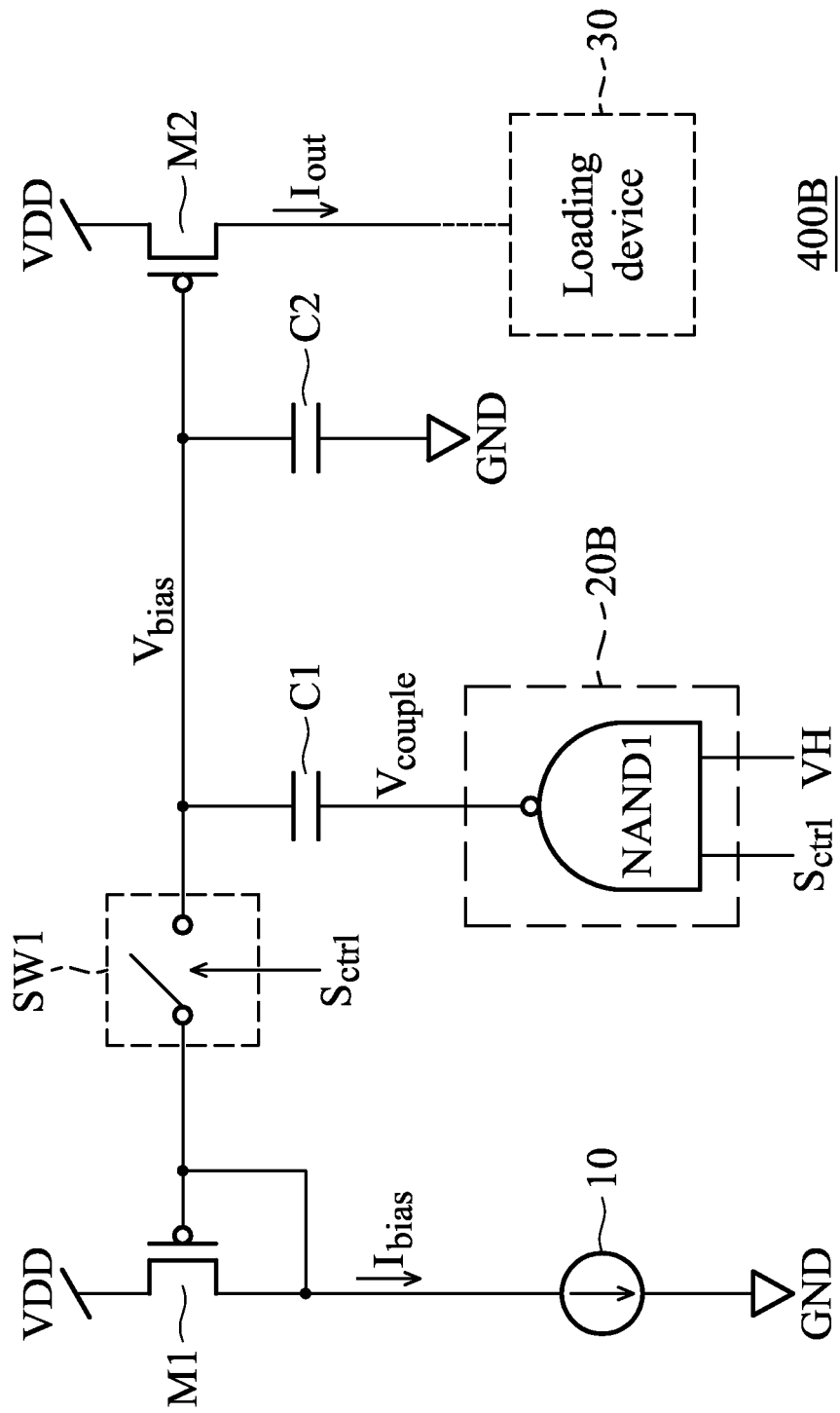
FIG. 4B shows a switching current source circuit according to another embodiment of the invention.

FIG. 4B shows a switching current source circuit 400B according to another embodiment of the invention. In the switching current source circuit 400B, a voltage generating unit 20B is a logic unit, and comprises an NAND logic gate NAND1. The NAND logic gate NAND1 provides the coupling voltage $V_{couple}$ according to the control signal $S_{ctrl}$ and the voltage VH corresponding to a high logic level. In the embodiment, the switch SW1 is turned on when the control signal $S_{ctrl}$ has a low logic level, and the switch SW1 is turned off when the control signal $S_{ctrl}$ has a high logic level. Furthermore, when the switch SW1 is turned on, the NAND logic gate NAND1 provides the coupling voltage having a low logic level to the capacitor C1. Moreover, when the switch SW1 is $V_{couple}$ turned off, the NAND logic gate NAND1 provides the coupling voltage $V_{couple}$ having a high logic level to the capacitor C1.

It is to be noted that the logic levels and voltage levels of the signals within the embodiments are used as an example, and are not meant to limit the invention. Furthermore, the switching current source circuit can be implemented in any type of switching circuits, such as a switched-capacitor integrator, a switched-capacitor filter, a switching regulator and the like.

Figure 5:
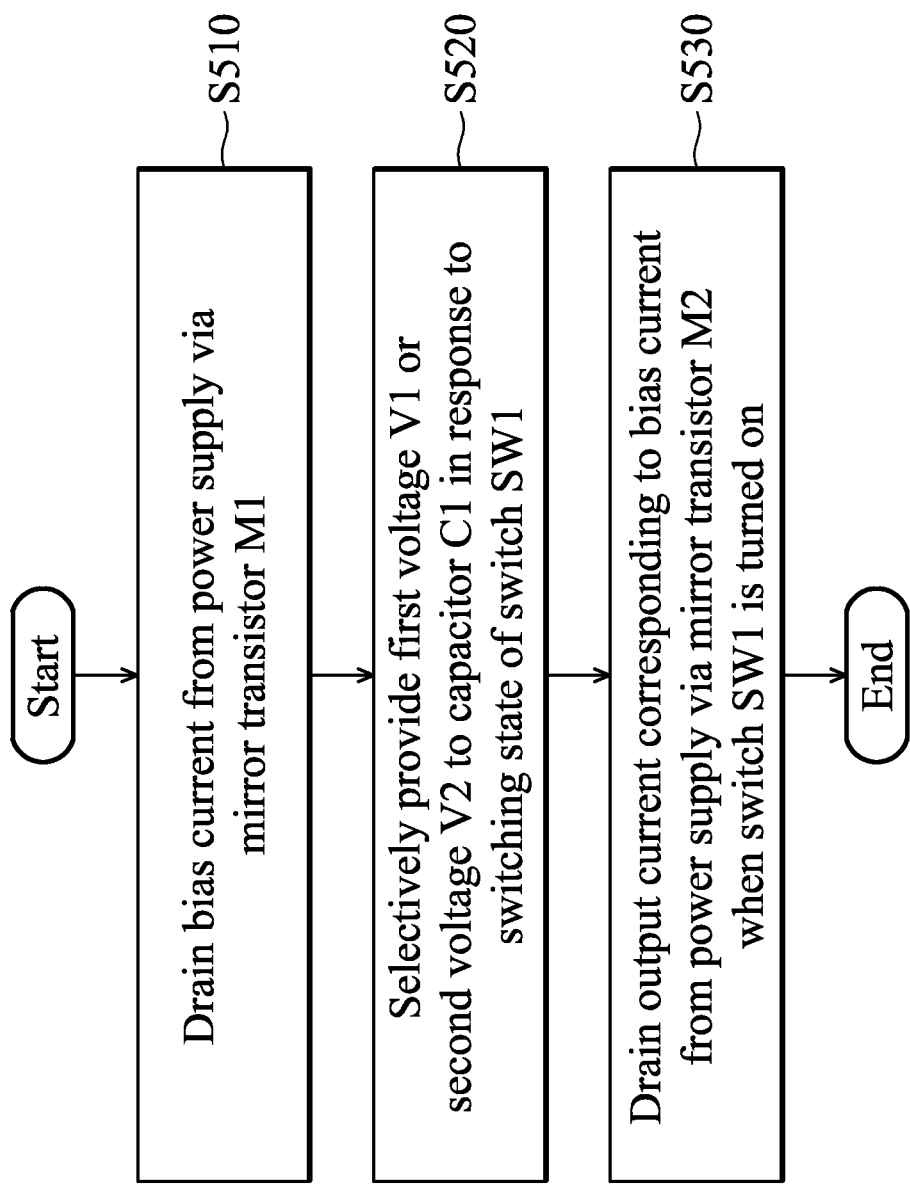
FIG. 5 shows a control method for a switching current source circuit according to an embodiment of the invention.

FIG. 5 shows a control method for a switching current source circuit according to an embodiment of the invention. Referring to FIG. 1 and FIG. 5 together, first, in step S510, the bias current $I_{bias}$ is drained from the power supply VDD via the mirror transistor M1. Next, in step S520, the voltage generating unit 20 selectively provides the first voltage V1 or the second voltage V2 to the capacitor C1 in response to a switching state of the switch SW1. As described above, when the switch SW1 is turned on and the gates of the mirror transistors M1 and M2 are connected, the voltage generating unit 20 provides the coupling signal $V_{couple}$ having the first voltage V1, so as to couple the coupling signal $V_{couple}$ to the gates of the mirror transistors M1 and M2 via the capacitor C1. Furthermore, when the switch SW1 is turned off and the gates of the mirror transistors M1 and M2 are disconnected, the voltage generating unit 20 provides the coupling signal $V_{couple}$ having the second voltage V2, so as to couple the coupling signal $V_{couple}$ to the gate of the mirror transistor M2 via the capacitor C1. Furthermore, the output current $I_{out}$ corresponding to the bias current $I_{bias}$ is drained from the power supply VDD via the mirror transistor M2 when the switch SW1 is turned on (step S530).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A switching current source circuit, comprising:
   a first mirror transistor coupled between a power supply and a current source, having a gate coupled to the current source, wherein the current source drains a bias current from the power supply via the first mirror transistor;
   a second mirror transistor, having a source coupled to the power supply, a gate coupled to the gate of the first mirror transistor, and a drain for providing an output current;
   a switch coupled between the gates of the first and second mirror transistors, having a control terminal for receiving a control signal;
   a voltage generating unit receiving the control signal;
   a first capacitor coupled between the gate of the second mirror transistor and the voltage generating unit; and
   a second capacitor coupled between the gate of the second mirror transistor and a ground,
   wherein the voltage generating unit selectively provides a first voltage or a second voltage different from the first voltage to the first capacitor according to the control signal.

2. The switching current source circuit as claimed in claim 1, wherein when the switch is turned on by the control signal, the voltage generating unit provides the first voltage to the first capacitor, and when the switch is turned off by the control signal, the voltage generating unit provides the second voltage to the first capacitor.

3. The switching current source circuit as claimed in claim 1, wherein the voltage generating unit comprises:
   a first switch coupled to the first capacitor, providing the first voltage to the first capacitor according to the control signal; and
   a second switch coupled to the first capacitor, providing the second voltage to the first capacitor according to a signal complementary to the control signal.

4. The switching current source circuit as claimed in claim 1, wherein the voltage generating unit is a logic unit, wherein when the switch is turned on by the control signal, the logic unit provides the first voltage corresponding to a first logic level to the first capacitor, and when the switch is turned off by the control signal, the logic unit provides the second voltage corresponding to a second logic level to the first capacitor, wherein the second logic level is complementary to the first logic level.

5. The switching current source circuit as claimed in claim 1, wherein the voltage generating unit is a digital-to-analog converter for providing an analog signal, wherein when the switch is turned on by the control signal, the digital-to-analog converter provides the analog signal having the first voltage to the first capacitor, and when the switch is turned off by the control signal, the digital-to-analog converter provides the analog signal having the second voltage to the first capacitor.

6. The switching current source circuit as claimed in claim 1, wherein the second capacitor is a parasitic capacitor.

7. A control method for a switching current source circuit, wherein the switching current source circuit comprises a transistor pair formed by first and second mirror transistors, a switch coupled between gates of the first and second mirror transistors, the switch being controlled by a control signal, a first capacitor coupled to the gate of the second mirror transistor, and a second capacitor coupled between the gate of the second mirror transistor and a ground, comprising:
   draining a bias current from a power supply via the first mirror transistor;
   draining an output current corresponding to the bias current from the power supply via the second mirror transistor when the switch is turned on; and
   selectively providing a first voltage or a second voltage different from the first voltage to the first capacitor in response to a switching state of the switch, by a voltage generating unit receiving the control signal.

8. The control method as claimed in claim 7, wherein the step of selectively providing the first voltage or the second voltage to the first capacitor in response to the switching state of the switch further comprises:
   providing the first voltage to the first capacitor when the switch is turned on, wherein a voltage of a gate of the second mirror transistor has a first level; and
   providing the second voltage to the first capacitor when the switch is turned off, wherein the voltage of the gate of the second mirror transistor has a second level,
   wherein a difference between the first and second levels is determined by a difference between the first and second voltages and a ratio of the first capacitor and the sum of the first and second capacitors.

9. The control method as claimed in claim 7, wherein the voltage generating unit comprises:
   a first switch coupled to the first capacitor, providing the first voltage to the first capacitor according to the control signal; and a second switch coupled to the first capacitor, providing the second voltage to the first capacitor according to a signal complementary to the control signal.

10. The control method as claimed in claim 7, wherein the voltage generating unit is a logic unit, wherein when the switch is turned on by the control signal, the logic unit provides the first voltage corresponding to a first logic level to the first capacitor, and when the switch is turned off by the control signal, the logic unit provides the second voltage corresponding to a second logic level to the first capacitor, wherein the second logic level is complementary to the first logic level.

11. The control method as claimed in claim 7, wherein the voltage generating unit is a digital-to-analog converter for providing an analog signal, wherein when the switch is turned on by the control signal, the digital-to-analog converter provides the analog signal having the first voltage to the first capacitor, and when the switch is turned off by the control signal, the digital-to-analog converter provides the analog signal having the second voltage to the first capacitor.

12. The control method as claimed in claim 7, wherein the second capacitor is a parasitic capacitor.

13. A control method for a switching current source circuit, wherein the switching current source circuit comprises a first mirror transistor coupled between a power supply and a current source, and a second mirror transistor coupled between the power supply and a loading device, comprising:
    draining a bias current from the power supply to the current source via the first mirror transistor;
    selectively connecting or disconnecting gates of the first and second mirror transistors utilizing a switch controlled by a control signal;
    coupling a first voltage provided by a voltage generating unit to the gate of the second mirror transistor when the gates of the first and second mirror transistors are connected; and
    coupling a second voltage provided by the voltage generating unit to the gate of the second mirror transistor when the gates of the first and second mirror transistors are disconnected, the second voltage being different from the first voltage,
    wherein when the gates of the first and second mirror transistors are connected, an output current corresponding to the bias current is drained from the power supply to the loading device via the second mirror transistor, and wherein the voltage generating unit receives the control signal and selectively provides one of the first voltage and the second voltage according to the control signal.

14. The control method as claimed in claim 13, wherein the switch is coupled between the gates of the first and second mirror transistors.

15. The control method as claimed in claim 13, wherein the switching current source circuit further comprises a first capacitor coupled between the gate of the second mirror transistor and the voltage generating unit.

16. The control method as claimed in claim 15, wherein the voltage generating unit comprises:
    a first switch coupled to the first capacitor, providing the first voltage to the first capacitor according to the control signal; and
    a second switch coupled to the first capacitor, providing the second voltage to the first capacitor according to a signal complementary to the control signal.

17. The control method as claimed in claim 15, wherein the voltage generating unit is a logic unit, wherein when the gates of the first and second mirror transistors are connected, the logic unit provides the first voltage corresponding to a first logic level to the first capacitor, and when the gates of the first and second mirror transistors are disconnected, the logic unit provides the second voltage corresponding to a second logic level to the first capacitor, wherein the second logic level is complementary to the first logic level.

18. The control method as claimed in claim 15, wherein the voltage generating unit is a digital-to-analog converter, wherein when the gates of the first and second mirror transistors are connected, the digital-to-analog converter provides the first voltage to the first capacitor, and when the gates of the first and second mirror transistors are disconnected, the digital-to-analog converter provides the second voltage to the first capacitor.

19. The control method as claimed in claim 13, wherein the switching current source circuit further comprises a second capacitor coupled between the gate of the second mirror transistor and a ground.

20. The control method as claimed in claim 19, wherein the second capacitor is a parasitic capacitor.

* * * * *